United States Patent [19]

Ozaki et al.

[11] Patent Number: 5,414,655
[45] Date of Patent: May 9, 1995

[54] SEMICONDUCTOR MEMORY DEVICE HAVING A STACK-TYPE CAPACITOR

[75] Inventors: Tohru Ozaki, Tokyo, Japan; Hiroshi Takato; Akihiko Nitayama, both of Wappingers Falls, N.Y.

[73] Assignee: Kabushiki Kaisha Toshiba, Kawasaki, Japan

[21] Appl. No.: 94,421

[22] Filed: Jul. 16, 1993

[30] Foreign Application Priority Data

Jul. 17, 1992 [JP] Japan .................................. 4-191120

[51] Int. Cl.⁶ ............................................. G11C 11/24
[52] U.S. Cl. .................................... 365/149; 257/303;
257/306
[58] Field of Search ............... 257/306, 341, 354, 382,
257/532, 535, 538, 301, 302, 303, 304, 296;
365/145, 149, 182

[56] References Cited

U.S. PATENT DOCUMENTS 4,994,893  2/1991  Ozaki et al. ........................ 257/306
5,025,301  6/1991  Shimizu ............................. 257/296
5,075,745  12/1991 Ino .................................... 257/306

FOREIGN PATENT DOCUMENTS 0443958  8/1991  European Pat. Off. .
0476584  3/1992  European Pat. Off. .
1-179449  7/1989  Japan .

Primary Examiner—Joseph A. Popek
Assistant Examiner—F. Niranjan
Attorney, Agent, or Firm—Oblon, Spivak, McClelland, Maier & Neustadt

[57] ABSTRACT

A semiconductor device of this invention includes a semiconductor substrate, at least one memory cell section including a number of memory cells each formed of a capacitor and a MOS transistor formed on the semiconductor substrate, a peripheral circuit section formed on the semiconductor substrate in an area other than an area in which the memory cell section is formed, and a wiring layer serving as an upper electrode of the capacitor and serving as a wire of the peripheral circuit section.

21 Claims, 12 Drawing Sheets

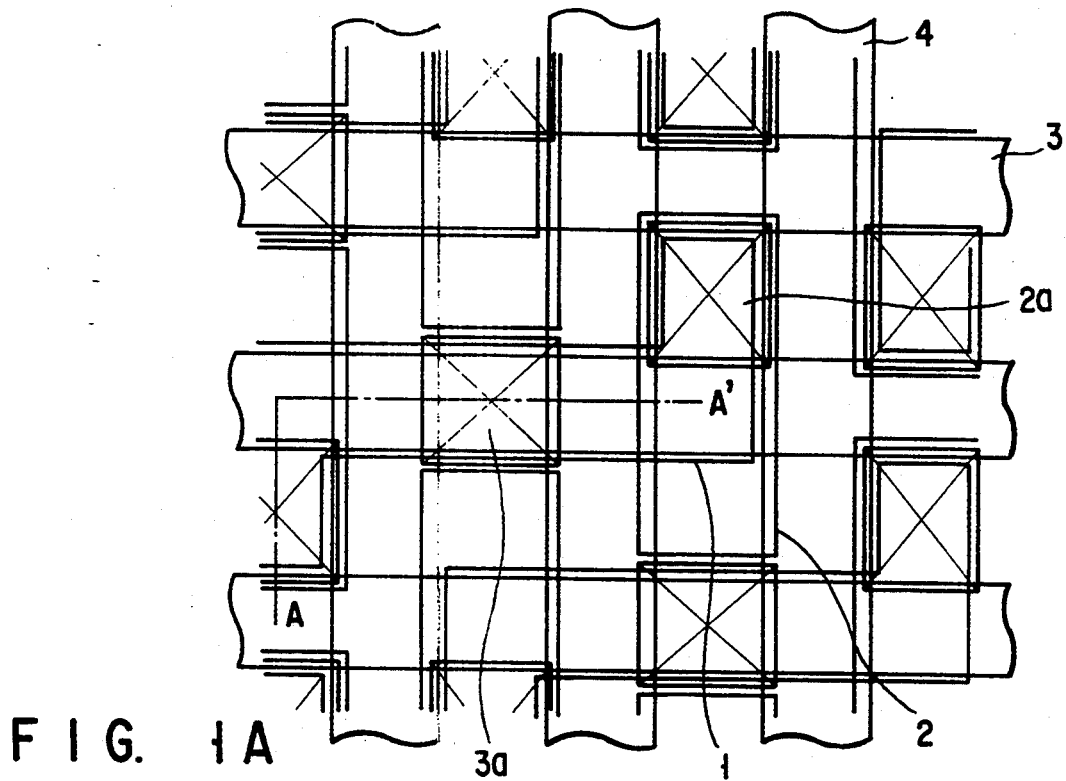
F I G. 1A
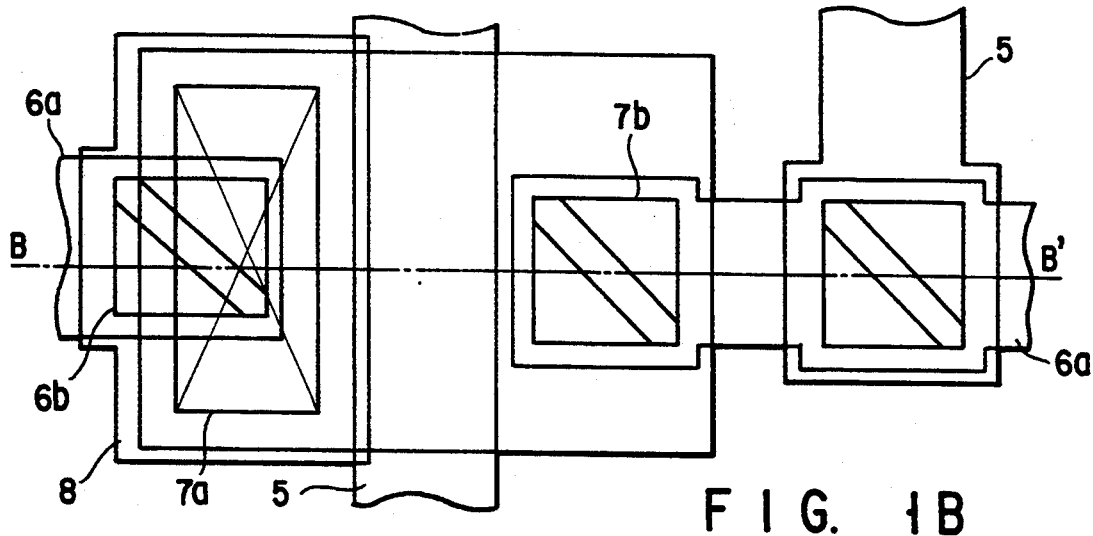
F I G. 1B
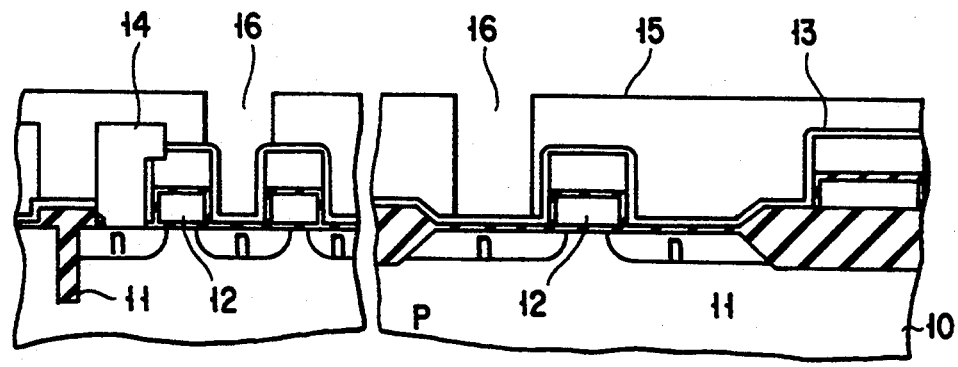
F I G. 2

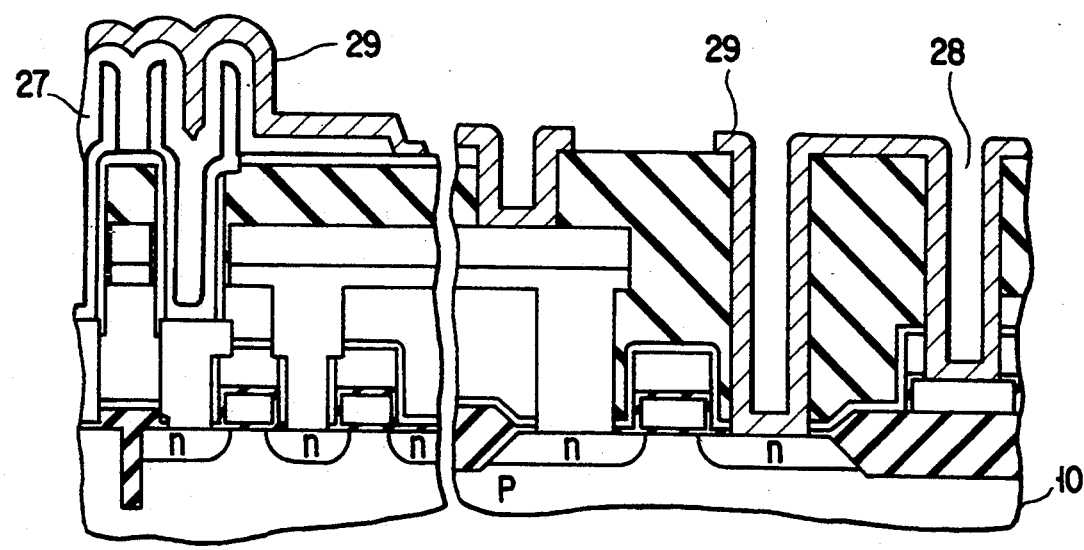
F I G. 19
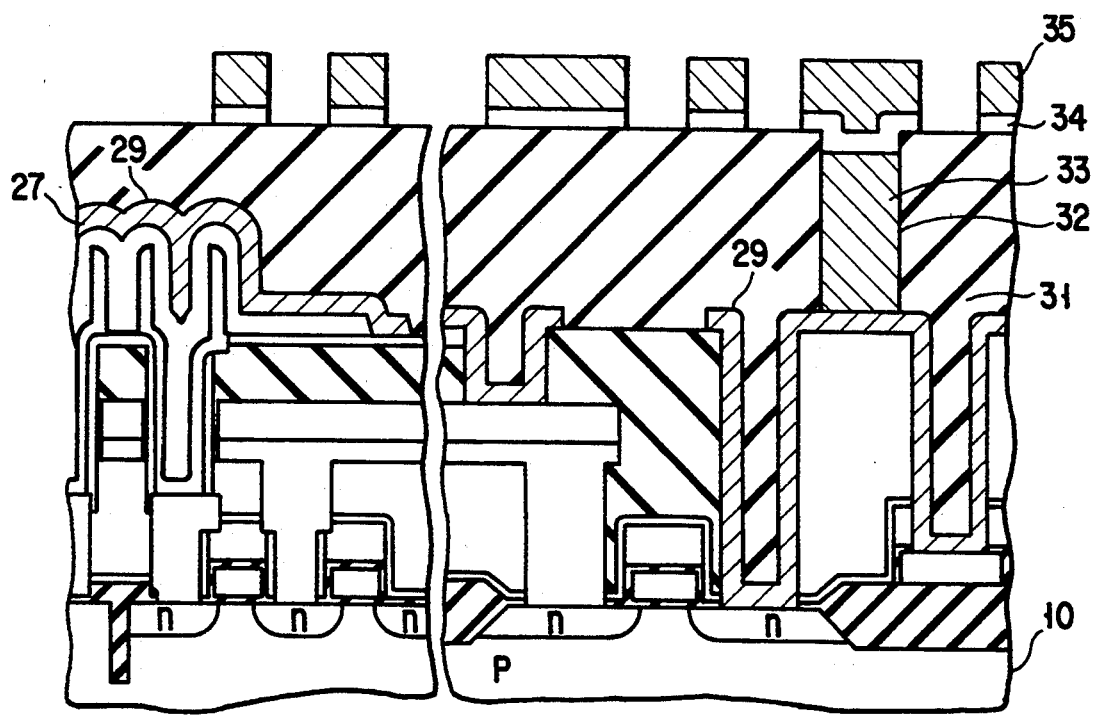
F I G. 20

SEMICONDUCTOR MEMORY DEVICE HAVING A STACK-TYPE CAPACITOR

BACKGROUND OF THE INVENTION

1. Field of the Invention

This invention relates to a semiconductor memory device having a stack-type capacitor, for example, and more particularly to a semiconductor memory device obtained by improving the wiring layer of a dynamic random access memory (DRAM).

2. Description of the Related Art

In recent years, the integration density of the DRAM has been enhanced and the area of a capacitor for storing data or information (charges) has been further reduced accordingly. As a result, problems that the memory data is erroneously read out or a soft error is caused by α-rays to destroy the memory data may occur.

As a method of solving the above problems and attaining the high integration density and large capacity, the following method is proposed. AMOS capacitor is formed on a memory cell area, and one of the electrodes of the capacitor is electrically connected to one electrode of a switching transistor formed on the semiconductor substrate. A memory cell with the above structure is usually called a stack-type memory cell, the occupied area of the capacitor is substantially increased and the electrostatic capacity of the MOS capacitor is increased.

In the memory cell with the above structure, the storage node electrode can be formed to extend over the element separating region and the side wall of the storage node electrode can be used as a capacitor by increasing the film thickness of the storage node electrode so that the capacity thereof can be made several times larger than that of the planar structure. Further, since the diffusion layer of the storage node section includes only a diffusion region below the storage node electrode, the area of the diffusion layer for collecting charges generated by α-rays is extremely small and the cell structure which is highly resistive to the soft error can be obtained.

With the above structure, since the capacity of the DRAM larger than 64 Mbits becomes insufficient, a cylindrical type structure for increasing the capacitance of the capacitor by use of the side wall of the storage electrode and a storage electrode structure of fin-type structure having a storage electrode formed in a multi-layered form are proposed.

However, with the above storage electrode structure, the height of the storage electrode becomes large (500 to 1000 nm), and in the peripheral circuit section, there occurs a problem that wiring from the first Al wire to the lower layer or the contact to the substrate is deep and connection becomes difficult.

As described above, in the conventional stack-type DRAM, when it is desired to attain a sufficiently large storage capacity, the height of the storage node becomes large, an insulation film for planarization becomes thick and the contact hole becomes deep, thereby making it difficult to make connection with the substrate.

SUMMARY OF THE INVENTION

An object of this invention is to provide a semiconductor memory device with a structure which permits easy connection to the substrate in a contact hole in the peripheral circuit section while maintaining a sufficiently large storage capacity.

One aspect of this invention is to provide a semiconductor device which is characterized in that a contact to a lower-layer wire is formed by use of the same wiring layer as an upper electrode of a storage capacitor section and all of the first Al wires and lower-layer wires or contacts for the substrate or part of them except contacts having a large hole diameter are connected to the wiring layer.

In this case, if the plate electrode is used as the wiring layer by the normal method, connection between the contacts must be effected before deposition of the plate electrode and a problem that the capacitor insulation film is contaminated by the resist occurs. Therefore, it is preferable to form an opening in the contact after the first-layered plate electrode is formed and then deposit and process the second-layered electrode.

This invention is characterized by comprising a semiconductor substrate; at least one memory cell section including a plurality of memory cells each formed of a capacitor comprising an upper electrode, a lower electrode, and a capacitor insulative layer therebetween and a MOS transistor formed on the semiconductor substrate; a peripheral circuit section formed on the semiconductor substrate in an area other than an area in which the memory cell section is formed; and a wiring layer used as the upper electrode of the capacitor and used as a wire of the peripheral circuit section.

This invention is characterized by comprising a semiconductor substrate; at least one memory cell section including a plurality of memory cells each formed of a MOS transistor formed on the semiconductor substrate and a capacitor formed on the MOS transistor and having an upper electrode and a lower electrode opposite to the upper electrode through an insulation layer; a peripheral circuit section having a lower wiring layer and formed on the semiconductor substrate in an area other than an area in which the memory cell section is formed; a first wiring layer formed as the upper electrode of the capacitor on the insulation layer of the capacitor and the peripheral circuit section and connected to the lower-layer wire of the peripheral circuit section and the semiconductor substrate, the peripheral circuit section having contact holes selectively formed so as to etch a part of the first wiring layer; and a second wiring layer formed on the first wiring layer and in the contact holes.

This invention is characterized by comprising a semiconductor substrate; at least one memory cell section including a plurality of memory cells each formed of a MOS transistor formed on the semiconductor substrate and a capacitor formed on the MOS transistor and having an upper electrode and a lower electrode opposite to the upper electrode through an insulation layer; a peripheral circuit section having a lower wiring layer and formed on the semiconductor substrate in an area other than an area in which the memory cell section is formed; and a wiring layer formed of a plurality of layers including at least first and second wiring layers, wherein the wiring layer is formed as the upper electrode of the capacitor on the insulation layer of the capacitor and the peripheral circuit section; the upper wire of the second wiring layer containing the second wiring layer being connected to the lower-layer wire of the peripheral circuit section and the semiconductor substrate.

The features of preferable embodiments of this invention are as follows:

(1) The semiconductor memory device is of stack type.

(2) The first layer of the wire which is formed of the same layer as the upper electrode is formed of polycrystalline silicon, TiN, Ni or carbon and the second layer is formed of $WSi_2$, W, Ni, Al, Cu or TiN/W, TiN/Al, TiN/Cu, Ti/TiN/W, Ti/TiN/Al, Ti/TiN/Cu, $TiSi_2$/TiN/W, $TiSi_2$/TiN/Al, $TiSi_2$/TiN/Cu, TiB/W, TiB/Al, TiB/Cu, Ti/TiB/Al, Ti/TiB/W, Ti/TiB/Cu, $TiSi_2$/TiB/W, $TiSi_2$/TiB/Al, $TiSi_2$/TiB/Cu.

(3) The storage capacitor section is formed on the upper portion of the cell bit line and the wire having the same level layer (the layer which is formed at the same time) as the cell bit line has a pattern to cover the source/drain region in the peripheral circuit section.

(4) A bit line wire is arranged in such a pattern that a space between portions of the pattern is approximately 1 $\mu$m at maximum.

(5) The wire having the same level layer as the upper electrode of the storage capacitor is arranged in such a pattern that a space between portions of the pattern is approximately 1 $\mu$m at maximum.

(6) The active region is arranged such that a word line is disposed between adjacent bit line contacts when the storage capacitor section of the dynamic RAM is formed after formation of the word line.

According to the above structure of this invention, for example, the depth of the contact of the first Al wire is determined by a distance to the ground electrode wire of the lower layer. Therefore, the aspect ratio of approximately 4 to 5 (diameter: 0.4 $\mu$m, depth: 1.6 to 2 $\mu$m) is required in the conventional system, for example, in the 256-Mbit DRAM level, but the aspect ratio in this invention can be reduced to 2 to 3 (diameter: 0.4 $\mu$m, depth: 0.8 to 1.2 $\mu$m).

The ground electrode wire is a wiring layer which is originally necessary and a new layer for formation of the wiring layer is not necessary so that the above structure can be made without increasing the number of steps. Therefore, it becomes possible to enhance the reliability and manufacturing yield of the elements.

As described above, according to this invention, the upper electrode of the storage capacitor section is formed to have a laminated structure of two or more layers and the laminated upper electrode layer is connected to the lower-layer wire or the substrate as a wire in the peripheral circuit section so that the depth of the metal contact can be made shallow, thereby making it possible to manufacture a DRAM which can be easily manufactured and has a high reliability.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A and 1B are plan views showing the element structure of a DRAM according to a first embodiment of this invention;

FIG. 2 is a cross sectional view for illustrating the manufacturing step of the DRAM according to the first embodiment;

FIG. 19 is a cross sectional view for illustrating the manufacturing step of the DRAM according to a fifth embodiment;

FIG. 20 is a cross sectional view for illustrating the manufacturing step of the DRAM according to the fifth embodiment;

DETAILED DESCRIPTION OF THE PREFERRED EMBODIMENTS

Figure 3:
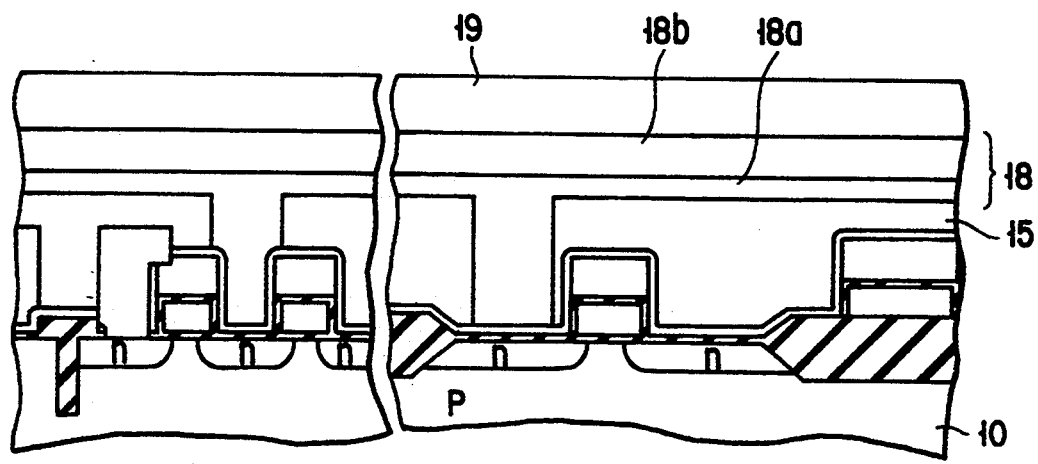
FIG. 3 is a cross sectional view for illustrating the manufacturing step of the DRAM according to the first embodiment.

There will now be described an embodiment of this invention with reference to the accompanying drawings.

FIGS. 1A and 1B are plan views showing the schematic structure of a DRAM according to a first embodiment of this invention. FIG. 1A is a plan view showing a memory section and FIG. 1B is a plan view showing an example of a peripheral circuit section other than the memory section.

The memory section includes active regions 1, storage electrode sections 2, storage electrode contacts 2a, bit lines 3, bit line contacts 3a, and word lines 4. The peripheral circuit section includes gates 5, first metal layers 6a, second metal layers 6b, first contacts 7a, second contacts 7b, and polycide layer 8.

The polycide layer 8 having the same level layer as the cell section bit line lies in part of the source/drain region and is used to connect the first metal layer 6a to the source/drain region and most of the source/drain regions are directly connected to the metal layer 6a having the same level layer as the upper electrode (plate electrode). All of the contacts of the first Al wire (second metal) layer 6b are connected to the first metal layers 6a.

FIGS. 2 to 7 are cross sectional views for illustrating the manufacturing steps in the first embodiment and the manufacturing method is explained below. The left hand portion in each of FIGS. 2 to 7 corresponds to the cross section taken along the line A—A' of FIG. 1A and the right hand portion corresponds to the cross section taken along the line B—B' of FIG. 1B.

A well region is formed in the surface layer of the Si substrate if necessary and an insulation film 11 for element separation is formed. In this case, the insulation film 11 in the peripheral circuit section is an oxide film formed by the LOCOS method and the insulation film 11 in the memory cell section is an oxide film for T-type trench separation. After this, a gate electrode 12 (gate 5) having a laminated structure of polysilicon/WSi is formed in the memory cell section and the peripheral circuit section, then an SiN film 13 is formed on the entire surface of the structure, and a polysilicon plug 14 of the storage capacitor contact section is formed in the memory cell section. Then, an LP-BPSG film 15 is deposited on the entire surface of the structure to make the surface flat and contact holes 16 (first contacts 7a) for making direct contact are formed (FIG. 2).

Portion of the SiN film 13 which is exposed to the contact hole 16 is removed by RIE and polysilicon is deposited on the entire surface to fill the contact hole 16 with a polysilicon film 18a. A WSi film 18b is formed on the polysilicon film 18a to form a polycide wire 18 (polycide layer 8) which will be used as bit lines of the memory cell section. After this, an SiO₂ film 19 is formed on the entire surface by the atmospheric pressure CVD method (FIG. 3).

Figure 4:
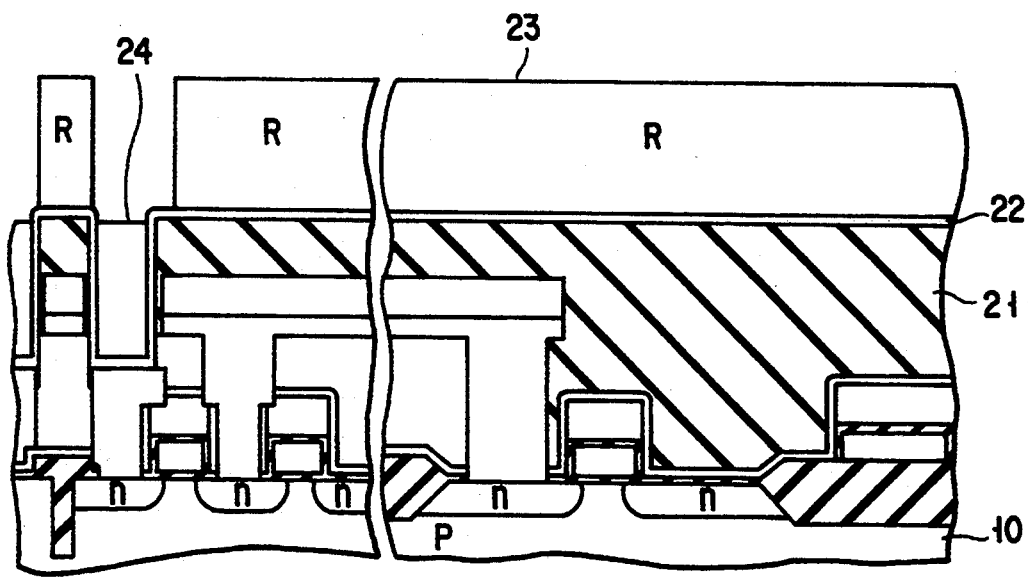
FIG. 4 is a cross sectional view for illustrating the manufacturing step of the DRAM according to the first embodiment.

After the polycide wire 18 is etched into a desired pattern, an inter-level insulation film 21 is formed on the entire surface to make the surface flat. Then, a contact hole is formed in the insulation film 21 in the memory cell section, an SiN film 22 is formed on the entire surface and an LP-BPSG film 24 is filled in between the bit lines of the cell section. Next, a resist 23 is formed and the contact of the storage capacitor section is opened. Thereafter, the SiN film 22 is removed by RIE (FIG. 4).

Figure 5:
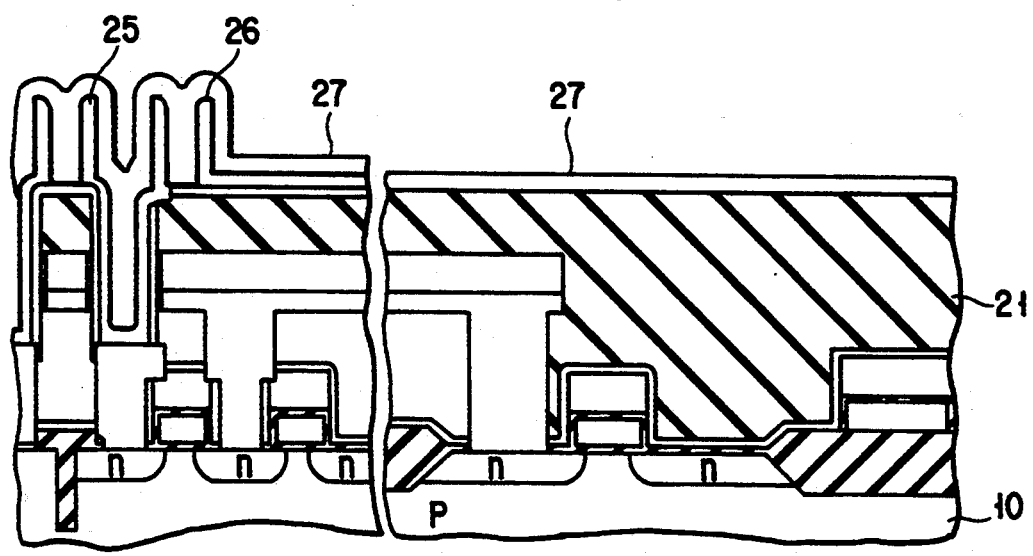
FIG. 5 is a cross sectional view for illustrating the manufacturing step of the DRAM according to the first embodiment.

After polysilicon is deposited, it is etched to form a polysilicon column 25 used as a storage electrode in the storage capacitor section. In this case, the polysilicon column 25 may be formed in a tubular form. After a Ta₂O₅ film 26 used as a capacitor insulation film is formed on the surface of the polysilicon column 25, a TiN film 27 acting as the first layer of the plate electrode is formed on the entire surface by the CVD method (FIG. 5).

Figure 6:
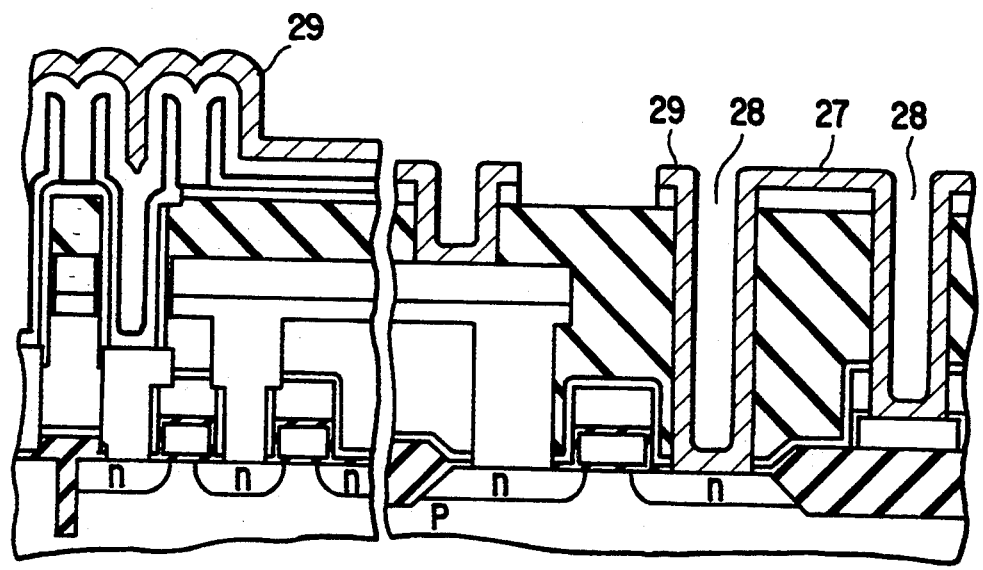
FIG. 6 is a cross sectional view for illustrating the manufacturing step of the DRAM according to the first embodiment.

After contact holes 28 (first contacts 7a) are formed in the peripheral circuit section, a W film 29 acting as the second layer of the plate electrode is formed by deposition. After this, the TiN film 27 and W film 29 are patterned by RIE to form a plate electrode wire (first metal layer 6a) (FIG. 6).

Figure 7:
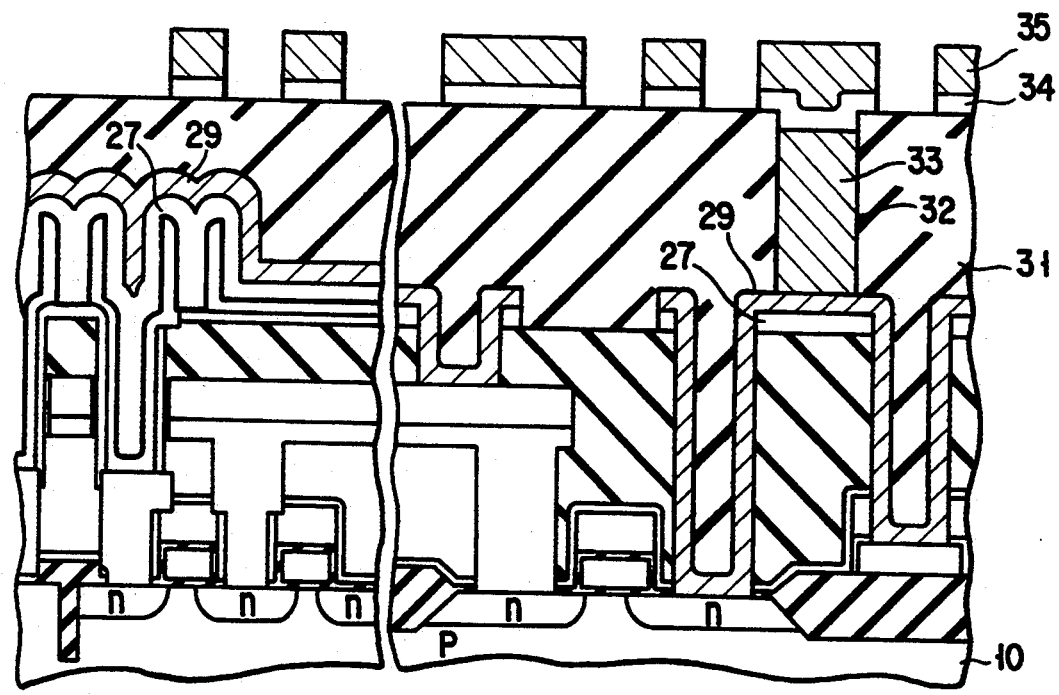
FIG. 7 is a cross sectional view for illustrating the manufacturing step of the DRAM according to the first embodiment.

After an inter-level insulation film 31 is formed on the entire surface to make the surface flat, a contact hole 32 is formed. A W film 33 is formed in the contact hole by selective growth to fill the contact hole 32. Then, a wiring layer (first Al wire (second metal layer) 6b) of TiN film 34 and Al film 35 is formed (FIG. 7).

Although not shown in the drawing, in the succeeding steps, deposition of an inter-level insulation film, formation of via-holes, selective growth of W, formation of a TiN/Al layer (second Al wire), and formation of a passivation film is effected to complete a DRAM.

In the DRAM formed as described above, the depth of the contacts of the first Al wires 34, 35 is not determined by a distance to the substrate 10, but is determined by a distance to the lower-layer electrode wires 27, 29 and can be made shallow. Therefore, connection between the first Al wires 34, 35 and the substrate 10 can be made easy. The electrode wires 27, 29 are inherently necessary wiring layers and it is not necessary to form new layers for formation of the wiring layers so that the above structure can be realized without increasing the substantial number of steps. Therefore, in the structure in which the storage electrode is made in a tubular form to increase the storage capacity, the contact between the first Al wire and the lower layer or the substrate in the peripheral circuit section can be stably obtained and the manufacturing yield and reliability can be enhanced.

In the first embodiment, since the active region is arranged such that one word line passes through a space between the adjacent bit line contacts as shown in FIGS. 1A and 1B, the contact sections of the storage electrodes can be separated from each other with a distance of the minimum processing size. Therefore, the manufacturing process can be made easy.

Figure 8A:
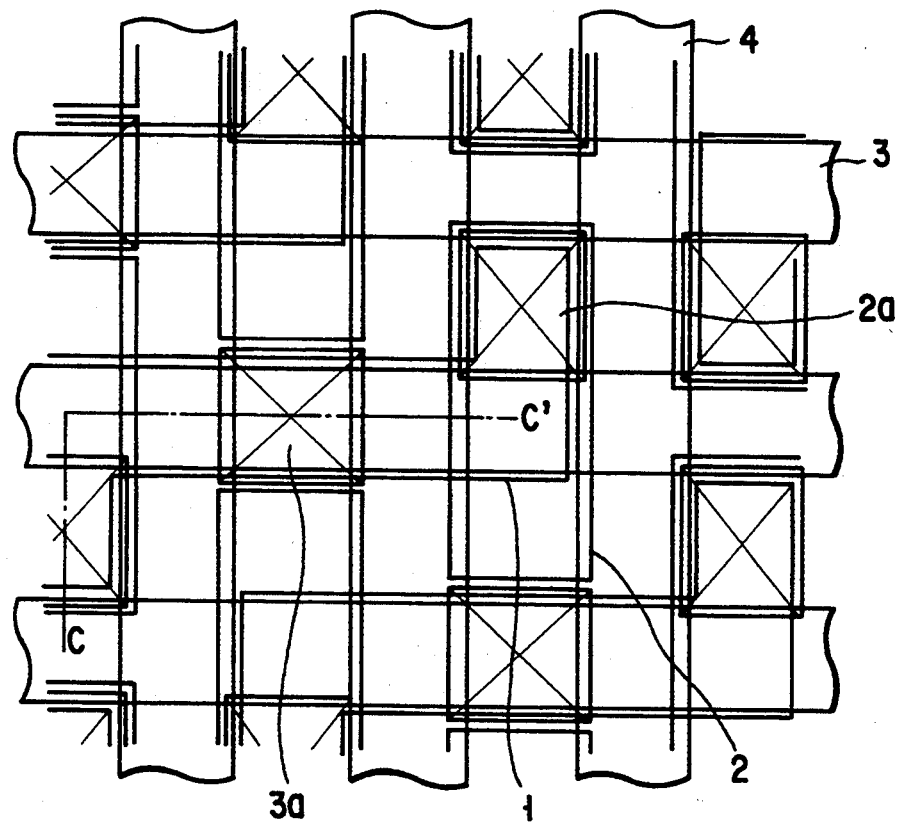
FIGS. 8A and 8B are plan views showing the element structure of a DRAM according to a second embodiment of this invention.
Figure 8B:
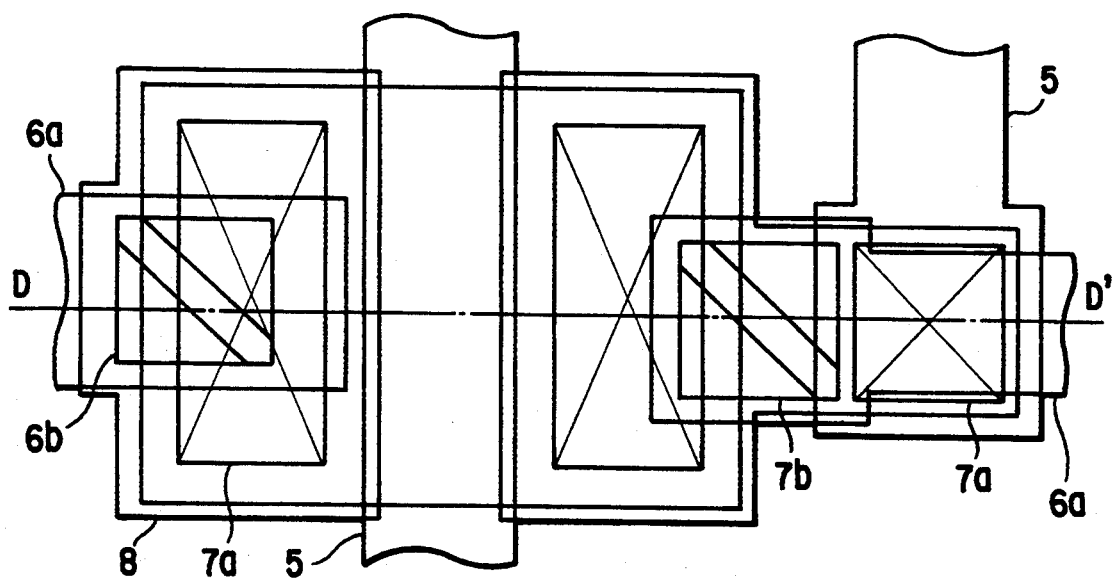

FIGS. 8A and 8B are plan views showing the schematic structure of a DRAM according to a second embodiment of this invention. FIG. 8A indicates a memory cell section and FIG. 8B indicates an example of a peripheral circuit section. Portions in FIGS. 8A and 8B which are the same as those of FIGS. 1A and 1B are denoted by the same reference numerals and the explanation therefore is omitted.

Cross sections for illustrating the steps in the second embodiment are shown in FIGS. 9 to 14. The left hand portion in each of FIGS. 9 to 14 corresponds to the cross section taken along the line C—C' of FIG. 8A and the right hand portion corresponds to the cross section taken along the line D—D' of FIG. 8B. Portions in FIGS. 9 to 14 which are the same as those of FIGS. 2 to 7 are denoted by the same reference numerals and the explanation therefore is omitted.

Figure 9:
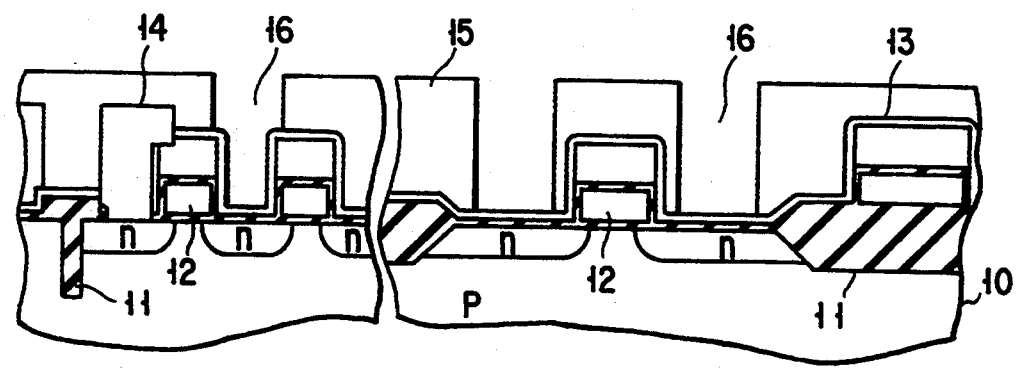
FIG. 9 is a cross sectional view for illustrating the manufacturing step of the DRAM according to the second embodiment.

Like the first embodiment, an element separating insulation film 11 is formed on an Si substrate 10, and then, a gate electrode 12, SiN film 13, polysilicon plug 14 are sequentially formed. After an LP-BPSG is formed to make the surface flat, contact holes 16 for direct contact are formed. At this time, unlike the first embodiment, the contact holes 16 are formed in the entire active region (FIG. 9).

Figure 10:
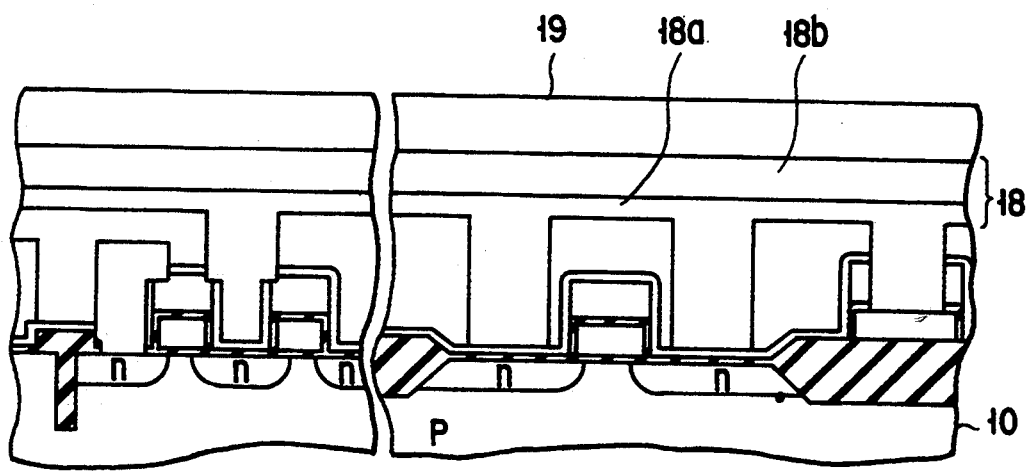
FIG. 10 is a cross sectional view for illustrating the manufacturing step of the DRAM according to the second embodiment.

Like the first embodiment, a polycide wire 18 is formed and an $SiO_2$ film 19 is formed on the wire (FIG. 10).

Figure 11:
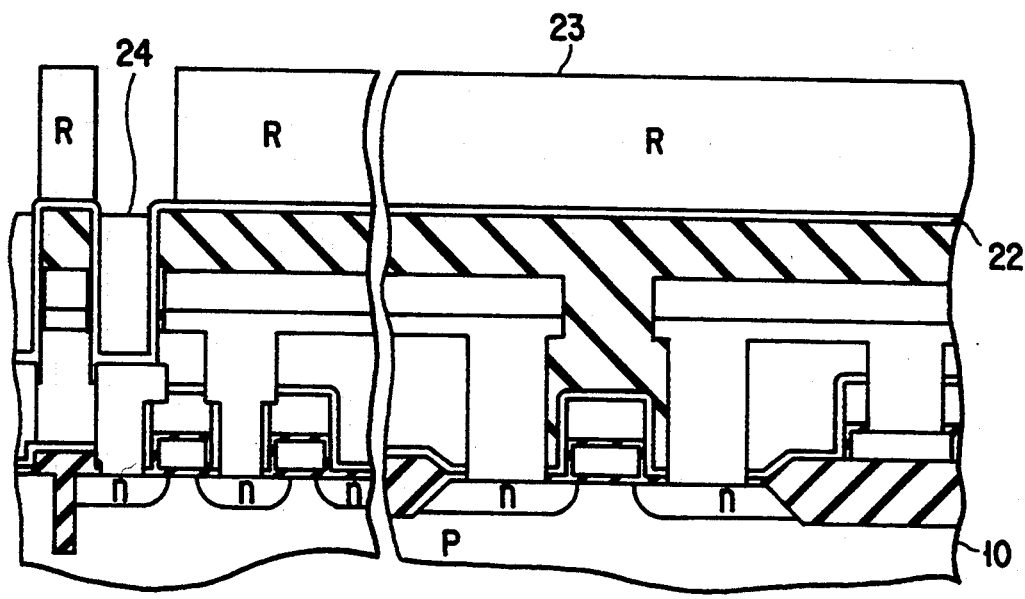
FIG. 11 is a cross sectional view for illustrating the manufacturing step of the DRAM according to the second embodiment.

Like the first embodiment, after the polycide wire 18 is etched in a desired pattern storage electrode section contacts are formed (FIG. 11).

Figure 12:
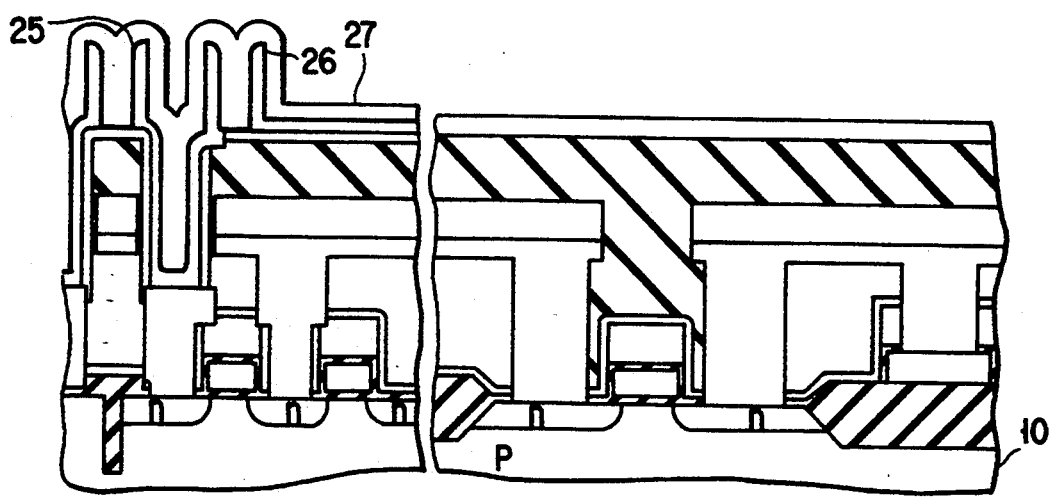
FIG. 12 is a cross sectional view for illustrating the manufacturing step of the DRAM according to the second embodiment.

Like the first embodiment, a polysilicon column 25 is formed, and a $Ta_2O_5$ film 26 used as a capacitor insulation film and a TiN film 27 used as the first layer of the plate electrode are formed (FIG. 12).

Figure 13:
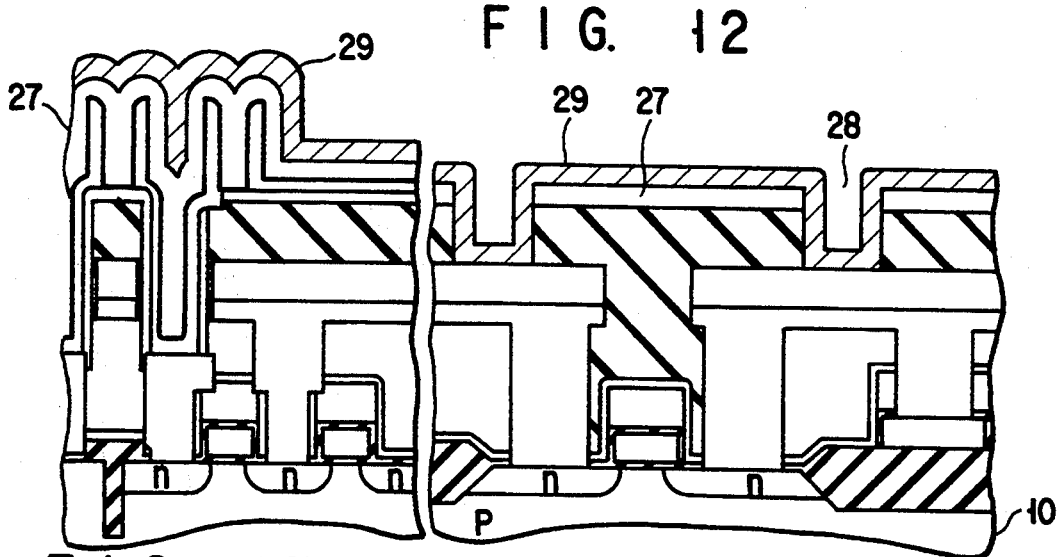
FIG. 13 is a cross sectional view for illustrating the manufacturing step of the DRAM according to the second embodiment.

After contact holes 28 are formed in the peripheral circuit section, a W film 29 used as the second layer of the plate electrode is formed (FIG. 13).

Figure 14:
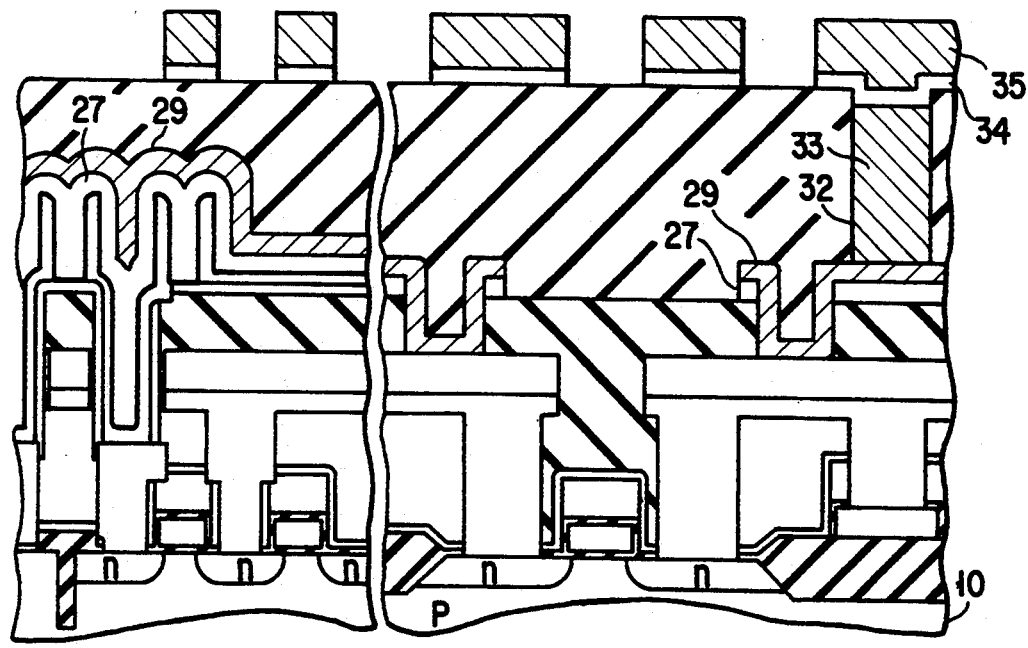
FIG. 14 is a cross sectional view for illustrating the manufacturing step of the DRAM according to the second embodiment.

After the W film 29 and TiN film 27 are patterned, an inter-level insulation film 31 is formed to make the surface flat. Then, a contact hole 32 is formed in the inter-level insulation layer 31 and a W film 33 is formed to fill the contact hole 32. After this, a wiring layer (first Al wire) of a TiN film 34 and an Al film 35 is formed (FIG. 14).

With the above structure, the same effect as that of the first embodiment can be obtained and an advantage that the depth of the contact formed of the electrode wires 27 and 29 in the peripheral circuit section can be made shallow can be obtained.

Figure 15:
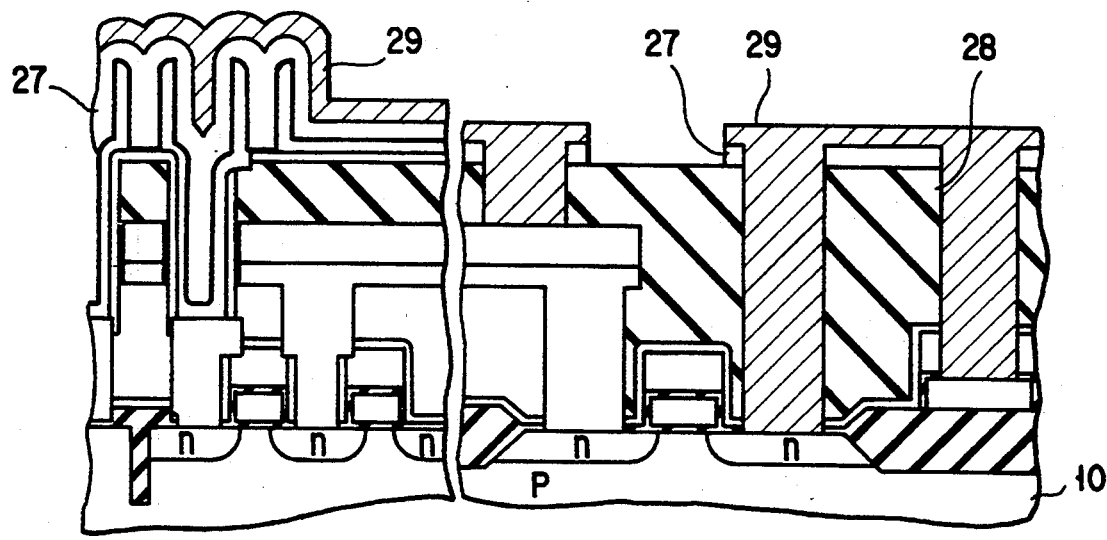
FIG. 15 is a cross sectional view for illustrating the manufacturing step of the DRAM according to a third embodiment.
Figure 16:
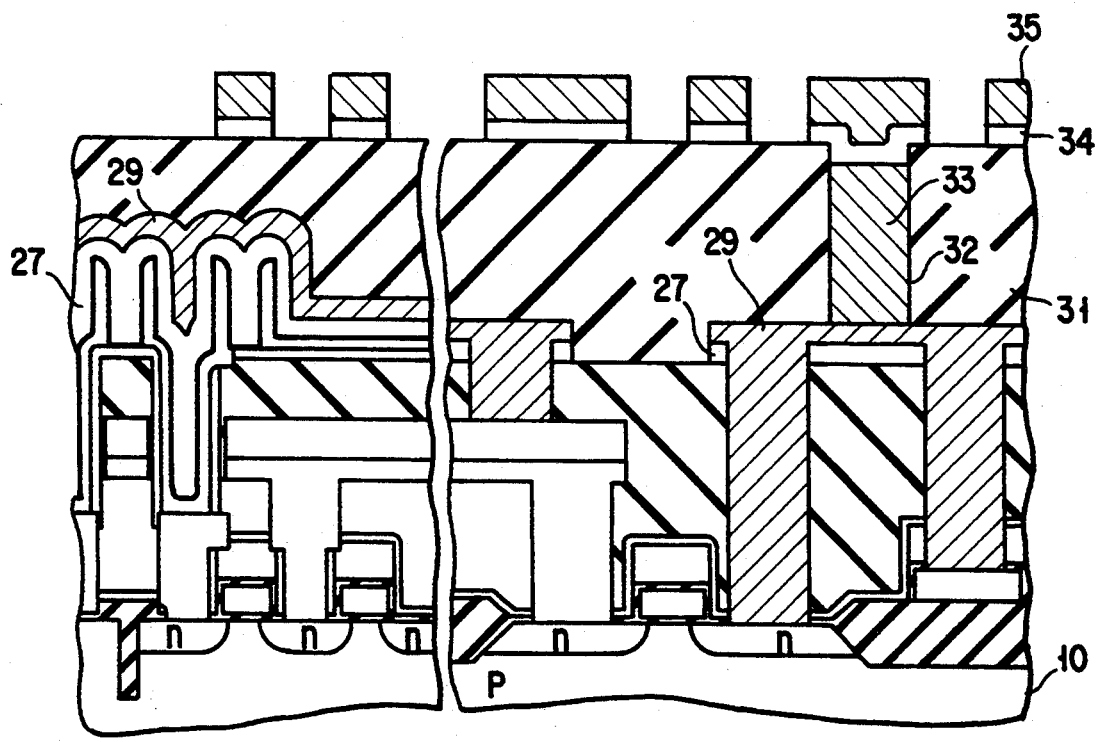
FIG. 16 is a cross sectional view for illustrating the manufacturing step of the DRAM according to the third embodiment.

FIGS. 15 and 16 are cross sectional views for illustrating the manufacturing process of a semiconductor device according to a third embodiment of this invention. In FIGS. 15 and 16, portions which are the same as those of FIGS. 2 to 7 are denoted by the same reference numerals and the detail explanation therefore is omitted.

In the third embodiment, the wire 29 of the first embodiment is constructed by filling W in the contact hole.

More specifically, part of the process in this embodiment is the same as the process up to the step of FIG. 5 in the first embodiment. After this process, the step of filling and growing the W film 29 in the contact hole 28 is effected (FIG. 15). Then, like the first embodiment, formation of an inter-level insulation film 31 and selective growth of a W film 33 into the contact hole 32 are effected and a wiring layer (first Al wire) of a TiN film 34 and an Al film 35 is formed (FIG. 16).

Figure 17:
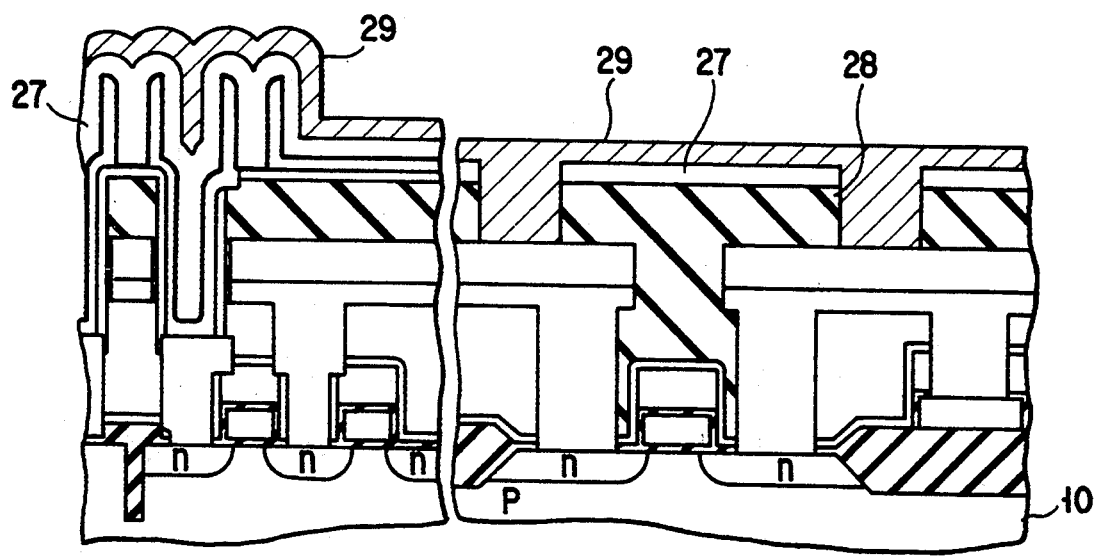
FIG. 17 is a cross sectional view for illustrating the manufacturing step of the DRAM according to a fourth embodiment.
Figure 18:
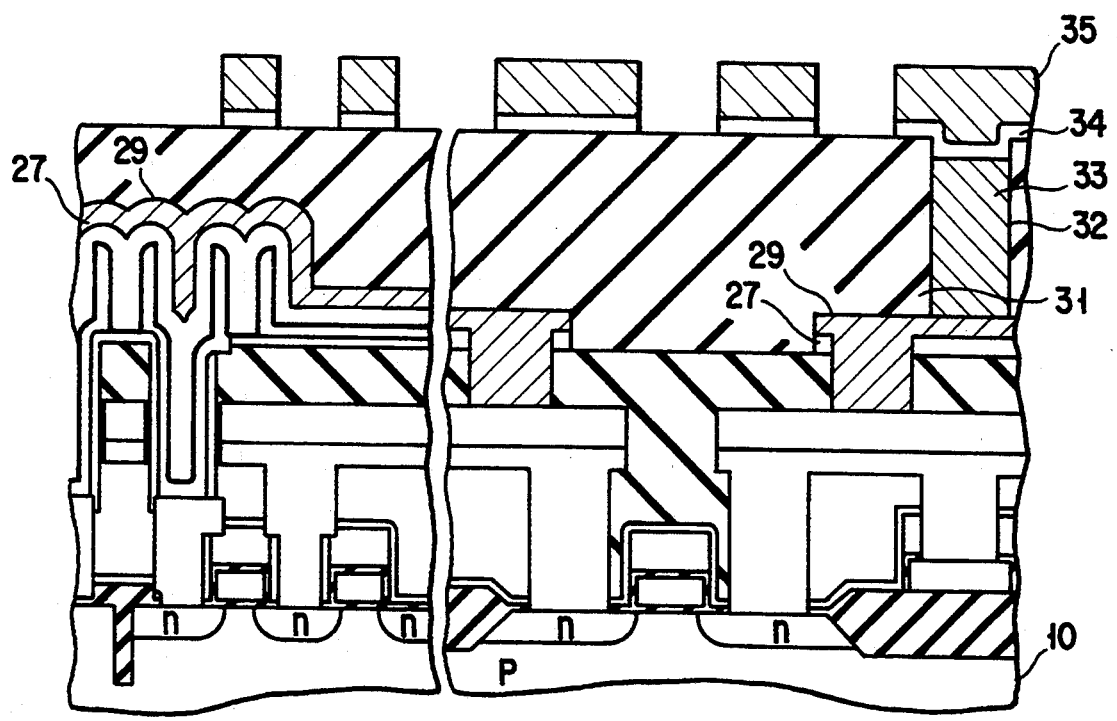
FIG. 18 is a cross sectional view for illustrating the manufacturing step of the DRAM according to the fourth embodiment.

FIGS. 17 and 18 are cross sectional views for illustrating the manufacturing process of a semiconductor device according to a fourth embodiment of this invention. In FIGS. 17 and 18, portions which are the same as those of FIGS. 9 to 14 are denoted by the same reference numerals and the detail explanation therefore is omitted.

In the fourth embodiment, the wire 29 of the second embodiment is constructed by filling W in the contact hole.

More specifically, part of the process in this embodiment is the same as the process up to the step of FIG. 12 in the second embodiment. After this process, the step of filling and growing the W film 29 in the contact hole 28 is effected (FIG. 17). Then, like the second embodiment, formation of an inter-level insulation film 31 and selective growth of a W film 33 into the contact hole 32 are effected and a wiring layer (first Al wire) of a TiN film 34 and an Al film 35 is formed (FIG. 18).

FIGS. 19 and 20 are cross sectional views for illustrating the manufacturing process of a semiconductor device according to a fifth embodiment of this invention. In FIGS. 19 and 20, portions which are the same as those of FIGS. 2 to 7 are denoted by the same reference numerals and the detail explanation therefore is omitted.

In the fifth embodiment, an example in which only the W film 29 of the plate electrode wire is used as a wire of the peripheral circuit is shown.

More specifically, part of the process in this embodiment is the same as the process up to the step of FIG. 5 in the first embodiment. After this process, a TiN film 27 is processed to cover only the memory cell section, a contact hole 28 is formed, a W film 29 is formed, and then the W film 29 is processed into a wire pattern (FIG. 19). Then, like the first embodiment, formation of an inter-level insulation film 31 and selective growth of a W film 33 into the contact hole 32 are effected and a wiring layer (first Al wire) of a TiN film 34 and an Al film 35 is formed (FIG. 20).

Figure 21A:
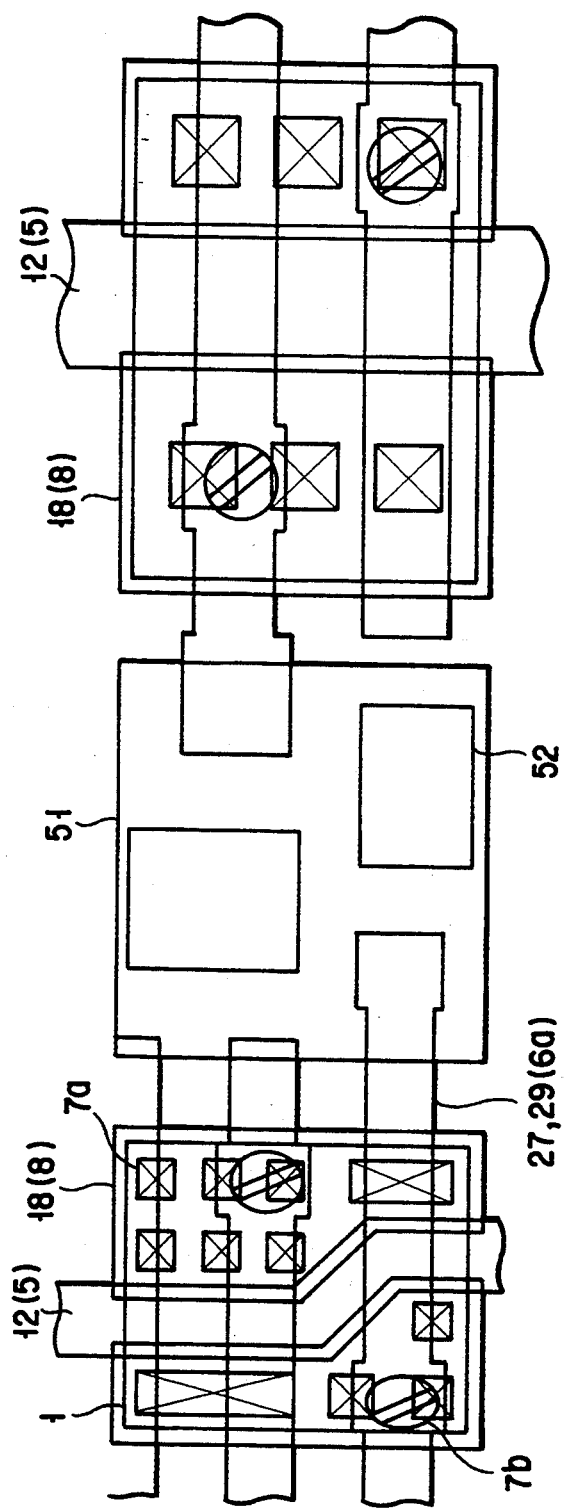
FIGS. 21A and 21B are a plan view and a cross sectional view showing the element structure of a DRAM according to a sixth embodiment of this invention.
Figure 21B:
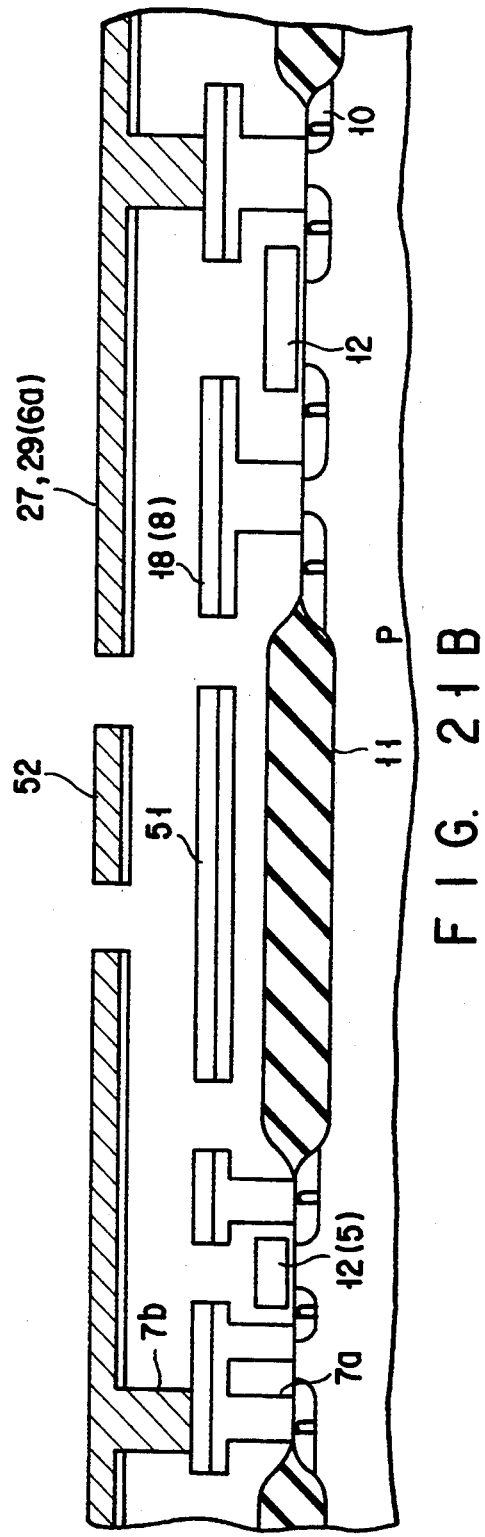

FIGS. 21A and 21B show the schematic construction of a sixth embodiment of this invention. FIG. 21A is a plan view and FIG. 21B is a cross sectional view. The sixth embodiment shows an example in which a dummy pattern is formed to make a substrate layer flat.

First contact holes 7a are formed in the source/drain sections and a polysilicon film is fully filled in the source/drain regions. A polycide wire 18 (polycide layer 8) is patterned to cover the source/drain sections. In the large separating region, a dummy pattern 51 of the polycide wire 18 is disposed such that a space between the pattern portions will not exceed 1 to 2 $\mu$m. Second contacts 7b are formed on the respective polycide wires 18 to connect the electrode wires 27, 29 (first metal wires 6a) and the polycide wires 18. Like the polycide wire 18, a dummy pattern 52 of the first metal wires 6a is formed such that a large space (1 to 2 $\mu$m) will not be provided.

As described above, in the sixth embodiment, the substrate layer can be easily made flat by forming the dummy patterns 51, 52 and the reliability of the upper layer wire can be enhanced.

Figure 22:
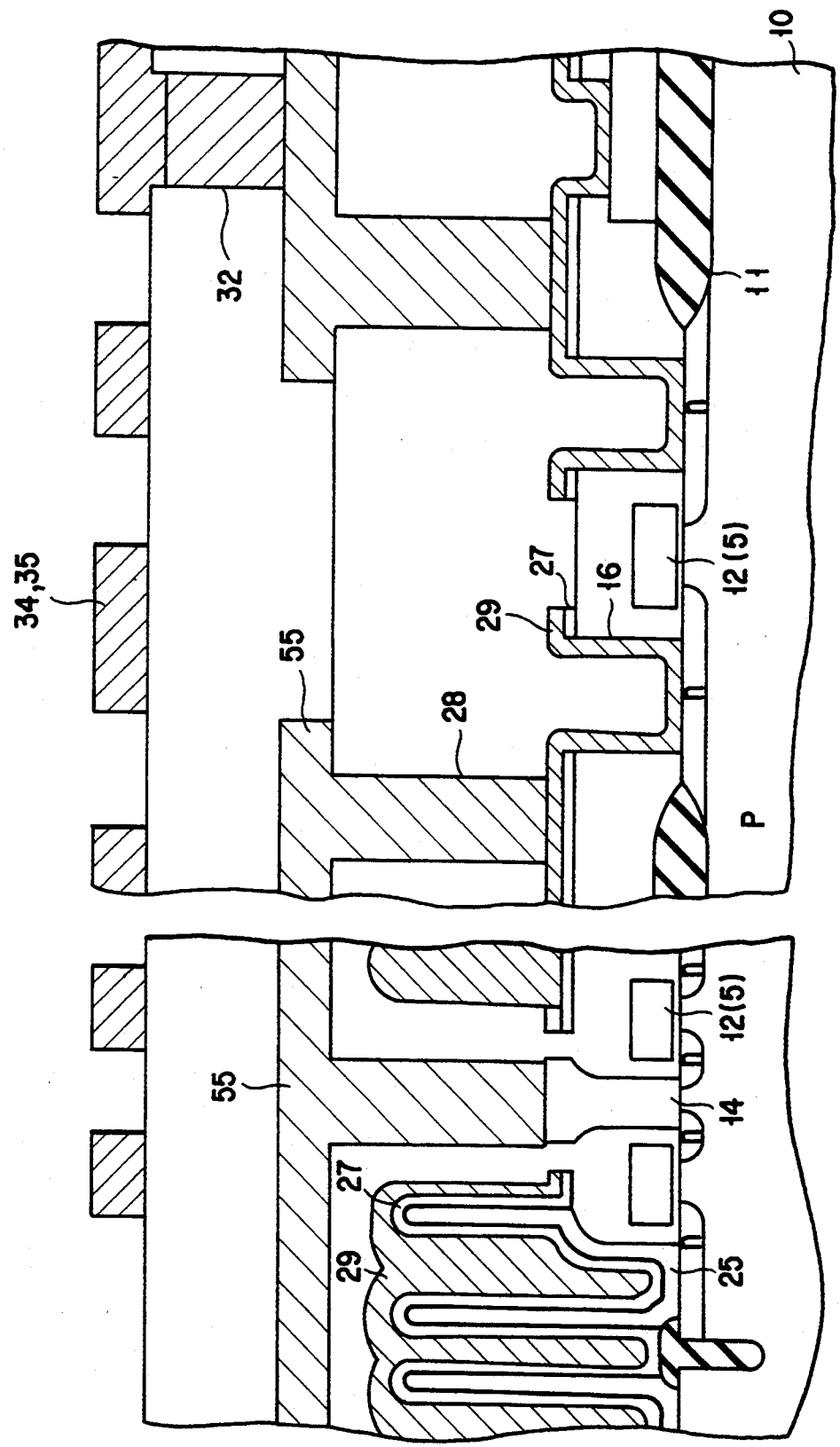
FIG. 22 is a cross sectional view showing the element structure of a DRAM according to a seventh embodiment of this invention.

FIG. 22 is a cross sectional view showing the schematic structure of a seventh embodiment of this invention. FIG. 7 shows an example in which cell bit lines are formed above the storage capacitor section. The source/drain sections are connected to circuit wires using the plate electrode layers 27, 29 of the storage capacitor section and wires of the first metal layers 55 used as the cell bit lines are all connected to the wires of the electrode layers 27, 29.

Figure 23:
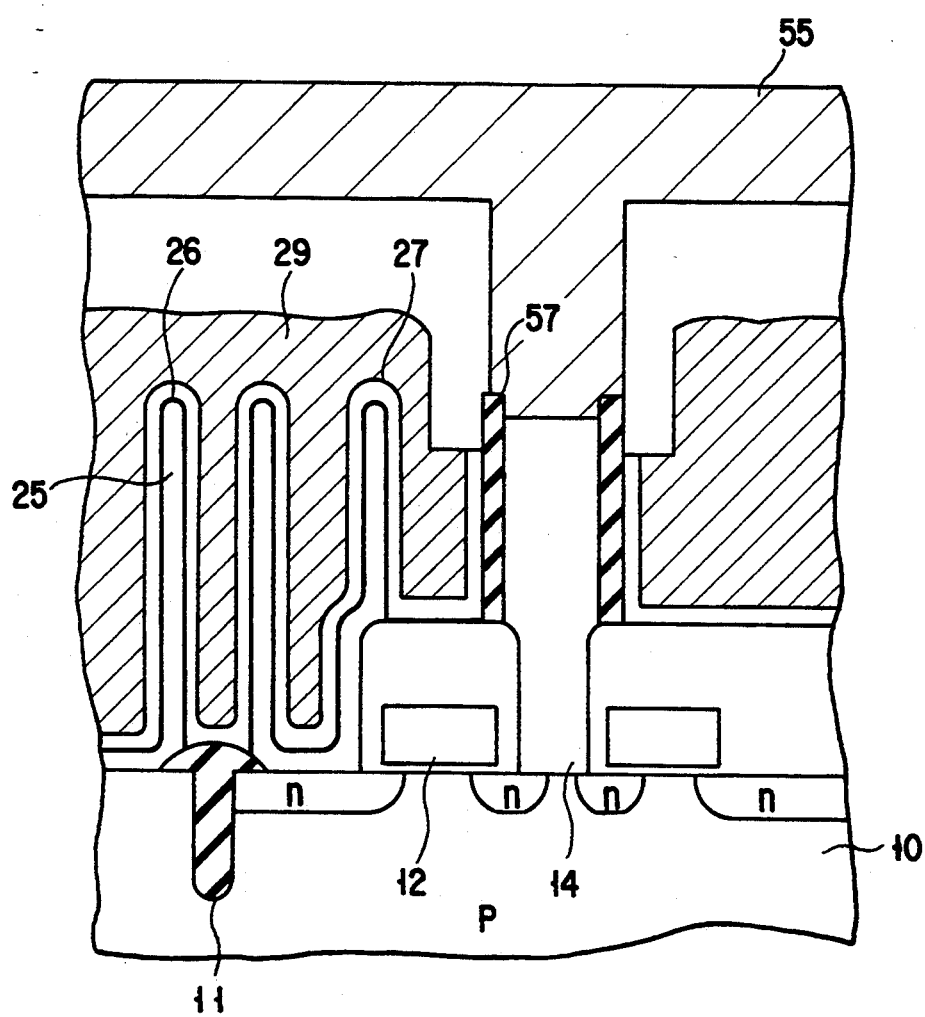
FIG. 23 is a cross sectional view showing the element structure of a DRAM according to an eighth embodiment of this invention.

FIG. 23 is a cross sectional view showing the schematic structure of an eighth embodiment of this invention. In the eighth embodiment, in order to attain the stable isolation between the polysilicon plug 14 of the memory cell section in the seventh embodiment and the electrode layers 27, 29, an insulation film 57 with fine structure, for example, $Si_3N_4$ is formed to surround the side surface of the polysilicon plug.

In the above embodiment, it is desirable to use polycrystalline silicon, TiN, Ni or carbon as the first layer of the wire which is formed of the same layer as the upper electrode, and use $WSi_2$, W, Ni, Al, Cu or TiN/W, TiN/Al, TiN/Cu, Ti/TiN/W, Ti/TiN/Al, Ti/TiN/Cu, $TiSi_2$/TiN/W, $TiSi_2$/TiN/Al, $TiSi_2$/-

TiN/CU, TiB/W, TiB/Al, TiB/CU, Ti/TiB/Al, Ti/TiB/W, Ti/TiB/CU, TiSi$_2$/TiB/W, TiSi$_2$/TiB/Al, TiSi$_2$/TiB/CU as the second layer.

Further, in each of the above embodiments, it is preferable to form the storage capacitor section above the cell bit lines and form the wire having the same level layer as the cell bit line in such as pattern as to cover the source and drain regions in the peripheral circuit sections.

In each of the above embodiments, it is also preferable to form the bit line wires in such a pattern that a space between the pattern portions will not exceed approximately 1 μm.

In addition, in each of the above embodiments, it is preferable to form the wire having the same level layer as the upper electrode of the storage capacitor in such a pattern that the maximum space between the pattern portions will be set to approximately 1 μm.

Further, in each of the above embodiments, it is preferable to arrange the active region such that one word line may be disposed between the adjacent bit line contacts in a case where the storage capacitor section of the dynamic RAM is formed after formation of the word lines.

This invention is not limited to the above embodiments and can be variously modified without departing the technical scope thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate;
   at least one memory cell section including a plurality of memory cells each formed of a capacitor comprising an upper electrode, a lower electrode, and a capacitor insulation layer formed therebetween, and a MOS transistor formed on said semiconductor substrate;
   a peripheral circuit section formed on said semiconductor substrate in an area other than an area in which said memory cell section is formed; and
   a wiring layer serving as said upper electrode of said capacitor and serving as a wire of said peripheral circuit section which wire is electrically separated from said upper electrode.

2. A semiconductor memory device according to claim 1, wherein said semiconductor memory device is of a stack type.

3. A semiconductor memory device according to claim 1, wherein said memory cell section comprises a layer of bit lines,
   capacitors are formed above said bit lines, and
   said peripheral circuit section has a wiring layer comprised of said layer of bit lines.

4. A semiconductor memory device according to claim 1, wherein said peripheral circuit section includes a sense amplifier and a row decoder.

5. A semiconductor memory device according to claim 1, wherein said wiring layer includes first and second wiring layers.

6. A semiconductor memory device according to claim 5, wherein said first layer is formed of one of polycrystalline silicon, TiN, Ni and carbon, and
   said second wiring layer is formed of one of WSi$_2$, W, Ni, Al and Cu or is formed of a multi-layer, which is selected from one of TiN/W, TiN/Al, TiN/Cu, Ti/TiN/W, Ti/TiN/Al, Ti/TiN/Cu, TiSi$_2$/TiN/W, TiSi$_2$/TiN/Al, TiSi$_2$/TiN/Cu, TiB/W, TiB/Al, TiB/Cu, Ti/TiB/Al, Ti/TiB/W, Ti/TiB/Cu, TiSi$_2$/W, TiSi$_2$/TiB/Al and TiSi$_2$/TiB/Cu.

7. A semiconductor memory device according to claim 6, wherein said first wiring layer is formed on an insulation layer covering said memory cell section and said peripheral circuit section, and said peripheral circuit section has contact holes formed therein passing through a part of said first wiring layer and said insulation layer, and wherein said second wiring layer is formed on said first wiring layer and within said contact holes so as to contact at least one of a lower-layer wire of said peripheral circuit section and said semiconductor substrate.

8. A semiconductor memory device according to any of claims 5 or 7, wherein
   said first wiring layer is comprised of a capacitor electrode material and said second wiring layer is comprised of a low resistivity wiring material.

9. A semiconductor memory device comprising:
   a semiconductor substrate;
   at least one memory cell section including a plurality of memory cells each formed of a capacitor comprising an upper electrode, a lower electrode, and a capacitor insulation layer formed therebetween, and a MOS transistor formed on said semiconductor substrate;
   a peripheral circuit section formed on said semiconductor substrate in an area other than an area in which said memory cell section is formed; and
   a wiring layer serving as said upper electrode of said capacitor and serving as a wire of said peripheral circuit section which wire is electrically separated from said upper electrode, wherein
   said wiring layer includes a first wiring layer and a second wiring layer,
   said first wiring layer is formed on an insulating layer covering said memory cell section and said peripheral circuit section,
   said peripheral circuit section has contact holes formed therein passing through a part of said first wiring layer and said insulating layer, and
   said second wiring layer is formed on said first wiring layer and within said contact holes so as to electrically contact at least one of a lower-layer wire of said peripheral circuit section and said semiconductor substrate.

10. A semiconductor memory device according to claim 9, wherein said semiconductor memory device is of a stack type.

11. A semiconductor memory device according to claim 9, wherein
   said memory cell section comprises a layer of bit lines,
   capacitors are formed above said bit lines, and
   said peripheral circuit section has a wiring layer comprised of said layer of bit lines.

12. A semiconductor memory device according to claim 9, wherein said memory cell section has a bit line wire formed of wire patterns spaced at maximum intervals of approximately 1 μm.

13. A semiconductor memory device according to claim 9, wherein said peripheral circuit section includes a sense amplifier and a row decoder.

14. A semiconductor memory device according to claim 9, wherein said first layer is formed of one of polycrystalline silicon, TiN, Ni and carbon, and said second wiring layer is formed of one of $WSi_2$, W, Ni, Al and Cu or is formed of a multi-layer, which is selected from one of TiN/W, TiN/Al, TiN/Cu, Ti/TiN/W, Ti/TiN/Al, Ti/TiN/Cu, $TiSi_2$/TiN/W, $TiSi_2$/TiN/Al, $TiSi_2$/TiN/Cu, TiB/W, TiB/Al, TiB/Cu, Ti/TiB/Al, Ti/TiB/W, Ti/TiB/Cu, $TiSi_2$/W, $TiSi_2$/TiB/Al and $TiSi_2$/TiB/Cu.

15. A semiconductor memory device comprising:
a semiconductor substrate;
at least one memory cell section including a plurality of memory cells each formed of a capacitor comprising an upper electrode, a lower electrode, and a capacitor insulation layer formed therebetween, and a MOS transistor formed on said semiconductor substrate;
a peripheral circuit section formed on said semiconductor substrate in an area other than an area in which said memory cell section is formed; and
a wiring layer serving as said upper electrode of said capacitor and serving as a wire of said peripheral circuit section which wire is electrically separated from said upper electrode, wherein said wiring layer includes a first wiring layer and a second wiring layer,
said first wiring layer is comprised of a capacitor electrode material, and said
second wiring layer is comprised of a material whose resistivity is lower than that of said first wiring layer.

16. A semiconductor memory device according to claim 14, wherein said semiconductor memory device is of a stack type.

17. A semiconductor memory device according to claim 15, wherein
said memory cell section comprises a layer of bit lines,
capacitors are formed above said bit lines, and
said peripheral circuit section has a wiring layer comprised of said layer of bit lines.

18. A semiconductor memory device according to claim 15, wherein said memory cell section has a bit line wire formed of wire patterns spaced at maximum intervals of approximately 1 μm.

19. A semiconductor memory device according to claim 15, wherein said peripheral circuit section includes a sense amplifier and a row decoder.

20. A semiconductor memory device according to claim 15, wherein said wiring layer includes first and second wiring layers.

21. A semiconductor memory device according to claim 15, wherein said first wiring layer is formed of polycrystalline silicon and said second wiring layer is formed of metal silicide.

* * * * *

UNITED STATES PATENT AND TRADEMARK OFFICE
CERTIFICATE OF CORRECTION

PATENT NO. : 5,414,655
DATED : May 9, 1995
INVENTOR(S) : Tohru OZAKI, et al.

It is certified that error appears in the above-indentified patent and that said Letters Patent is hereby corrected as shown below:

On the title page, Item [75], the third inventor's name should read:

--Akihiro Nitayama--

Signed and Sealed this

Fourth Day of July, 1995

Attest:

BRUCE LEHMAN

*Attesting Officer*     *Commissioner of Patents and Trademarks*